United States Patent [19]

Yassa et al.

[11] Patent Number: 5,124,656

[45] Date of Patent: Jun. 23, 1992

[54] ADAPTIVE ESTIMATION OF PHASE OR DELAY FOR BOTH LEADING AND LAGGING PHASE SHIFTS

[75] Inventors: Fathy F. Yassa, Clifton Park; Kenneth B. Welles, II, Scotia, both of N.Y.

[73] Assignee: General Electric Company, Schenectady, N.Y.

[21] Appl. No.: 589,355

[22] Filed: Sep. 28, 1990

[51] Int. Cl.$^5$ .......................... H03K 5/13; H03K 5/22
[52] U.S. Cl. ................................ 328/155; 328/55; 307/262; 307/602; 307/603; 307/511
[58] Field of Search ............... 328/55, 63, 72, 155; 307/511, 262, 269, 602, 603

[56] References Cited

U.S. PATENT DOCUMENTS 4,229,824  10/1980  En ......................................... 328/155
4,951,000   8/1990  Dautriche ............................. 328/55

OTHER PUBLICATIONS

Yassa et al., "Adaptive Phase/Delay Estimation for Lead/Lag Phase Shifts", Conference Record, Twenty-Third Asilomar Conference on Signals, Systems & Computers, Oct. 30–Nov. 1, 1989, pp. 284–288.
Robinson-Halpern, LVDT Product Catalog, pp. 1–5, 10 and 11.
Etter et al., "Adaptive Estimation of Time Delays in Sampled Data Systems", IEEE Trans. on ASSP, vol. ASSP-29, No. 3, pp. 582–587, Jun. 1981.
Etter, "Identification of Sparse Impulse Systems Using an Adaptive Delay Filter", Proc. ICASSP, 1985, pp. 1169–1172.
Reed et al., "Time Delay Estimation Using the LMS Adaptive Filter-Static Behavior", IEEE Trans. on ASSP, vol. ASSP-29, No. 3, pp. 561–570, Jun. 1981.
Feintuch et al., "Time Delay Estimation Using the LMS Adaptive Filter-Dynamic Behavior", IEEE Trans. On ASSP, vol. ASSP-29, No. 3, pp. 571–576, Jun. 1981.
Cabot, "A Note on the Application of the Hilbert Transform to Time Delay Estimation", IEEE Trans. on ASSP, vol. ASSP-29, No. 3, pp. 607–609, Jun. 1981.
Etter et al., "System Modelling Using an Adaptive Delay Filter", IEEE Trans. on Circuits and Systems, vol. CAS-34, No. 7, pp. 770–774, Jul. 1987.
Friedlander et al., "A Parametric Technique for Time Delay Estimation", IEEE Transactions on Aerospace and Electronic Systems, vol. AES-20, No. 6, Nov. 1984, pp. 729–735.
Smith et al., "Adaptive Interpolated Time-Delay Estimation", IEEE Transactions on Aerospace and Electronic Systems, vol. AES-21, No. 2, Mar. 1985.
Youn et al., "Comparison of Two Adaptive Methods for Time Delay Estimation", IEEE Transactions on Aerospace and Electronic Systems, vol. AES-20, No. 5, Sep. 1984.
Etter, "Adaptive Identification of Sparse Impulse Response Systems", Proc. 18th Asilomar Conf. Circuits, Syst., Comput., Nov. 1984, pp. 15–19.

*Primary Examiner*—Timothy P. Callahan
*Attorney, Agent, or Firm*—Marvin Snyder; James C. Davis, Jr.

[57] ABSTRACT

Apparatus for measuring or compensating for phase or time delay between a reference signal and a desired signal produces an approximate error signal by differentially summing the desired and reference signals. The appoximate error signal is then used, in a feedback loop, to control application of an adaptive delay to each of the reference and desired signals. The total lead or lag difference is represented by the difference between the two delays applied to the reference and desired signals, respectively. The phase or time delay measurement or compensation arrangements may be applied to linear variable differential transformers, synchronous AM detectors, zero crossing detectors and phase locked loops. Variations on this basic technique can yield substantially exact measurement or compensation. The invention is applicable to sampling arrangements including oversampling/decimation or interpolation/decimation to increase compensation accuracy to any desired degree.

23 Claims, 5 Drawing Sheets

ADAPTIVE ESTIMATION OF PHASE OR DELAY FOR BOTH LEADING AND LAGGING PHASE SHIFTS

BACKGROUND OF THE INVENTION

1. Field of the Invention

The present invention generally relates to apparatus for measuring or compensating for time delays or phase differences and, more particularly, relates to apparatus for measuring, or compensating for, time delays or phase differences between two electrical signals where one electrical signal can either lead or lag the other electrical signal.

2. Description of the Prior Art

There are numerous signal processing applications which require estimation of the difference in phase or difference in time of occurrence (both collectively referred to hereinafter as phase difference) between two time-varying signals, such as between a reference signal and another version of the reference signal which has undergone a phase shift due to a transmission or processing medium. Often such phase shift will take the form of a time delay, and arrangements are known for measuring or compensating for this condition. However, many applications must accommodate the condition where the desired signal may either lead or lag the reference signal. If compensation is required, it is desirable that it be performed adaptively.

To facilitate an understanding of the application of the invention and the shortcomings of the prior art, several examples will be considered.

Synchronous/Homogeneous AM Detection

In synchronous or homogeneous detection of an amplitude modulated signal, the demodulation algorithm assumes that both the transmitted modulated carrier signal and the local, synchronized carrier signal are in phase or homogeneous, which is not true in most practical applications. The modulation medium will typically cause a phase shift between the two versions of the carrier signal and can result in demodulation errors which are unacceptably high. Such errors, for instance, can cause a null when the carrier signals are 90° out of phase. A phase compensation network must be added to such a detection and demodulation system to obtain operability. Typically, in the prior art, a compensation scheme has been used which requires manual tuning and calibration and is also system and time dependent.

Ratioing Techniques

In linear variable differential transformer (LVDT) sensor applications, for instance, where the sensor primary winding is supplied with a carrier signal, the output signal of the sensor is an amplitude modulated carrier. Due to the transformer properties, the carrier signal undergoes some phase shift in addition to the modulation. In this case also, the demodulation algorithm assumes and requires that both the unmodulated carrier and the carrier component of the modulated signal be in phase. Ideally, the center tap of the transformer secondary represents ground potential and the output signal is taken differentially from the transformer secondary winding. Thus the output signal would be independent of core position and be equal to the carrier signal. However, non-linearities in the transformer lead to phase shifts between these differential output signals and careful circuit and transformer design has been required to maintain the transformer characteristics within predetermined limits to assure acceptable performance.

Zero Crossing Detection

Zero crossing detector are well understood and are in widespread use in communication equipment. Zero crossing detectors are also employed with reference and desired signals, so that a count of samples can be tracked to provide a coarse estimate of the amount of delay between the two signals, which may be sufficiently accurate for some applications. The resolution of such approach diminishes with increase in frequency of the signal and requires a high sampling rate. For example, for a carrier signal of 3 KHz and a sampling rate of 40 KHz, the sampling period would limit the resolution to 27° phase shift referenced to the carrier.

Phase-locked Loops

Phase locked loops may potentially be used to extract a homogeneous carrier from a desired signal. However, this has not been deemed practical since filtration of the feedback signal requires high order filtration which increases circuit complexity and cost disproportionately to the accuracy of the signal extracted. Therefore, phase-locked loops are not generally appropriate for high accuracy phase measurement applications.

Adaptive Compensation

Some known approaches for performing adaptive compensation of phase lag have developed from seismic and communications applications. Such an approach is schematically illustrated in connection with FIG. 1, described infra. While the algorithm employed with the circuit of FIG. 1 has been used successfully, it is limited to cases where the desired signal lags the reference signal; that is, the algorithm fails where the desired signal leads the reference.

In summary, phase compensation arrangements in the prior which could accommodate both leading and lagging phase differences have heretofore been incapable of adaptive operation or else placed severe economic or design constraints on the system in which they have been utilized. Arrangements capable of adaptive phase compensation have heretofore been operable to accommodate only phase lag conditions.

SUMMARY OF THE INVENTION

It is therefore an object of the present invention to provide a phase compensation or measurement arrangement which will accommodate both leading and lagging phase differences while providing phase compensation in an adaptive manner.

Another object of the invention is to provide a method of obtaining an estimate of the phase difference between a reference and a desired signal while compensating for both leading and lagging phase differences.

In order to accomplish the above objectives, a circuit is provided including a first input for receiving a time-varying reference signal, a second input for receiving a time-varying desired signal, a first controllable delay for delaying the time-varying reference signal in response to an error signal, a second controllable delay means for delaying the time-varying desired signal in response to the error signal, and a differential summing arrangement for generating the error signal in response to respective output signals of the first and second controllable delay means.

In accordance with another aspect of the invention, a method is provided for adaptively compensating for an arbitrary phase difference between two signals and includes the steps of differentially summing the two signals to derive an error signal and selectively delaying each of the two signals in response to the error signal.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
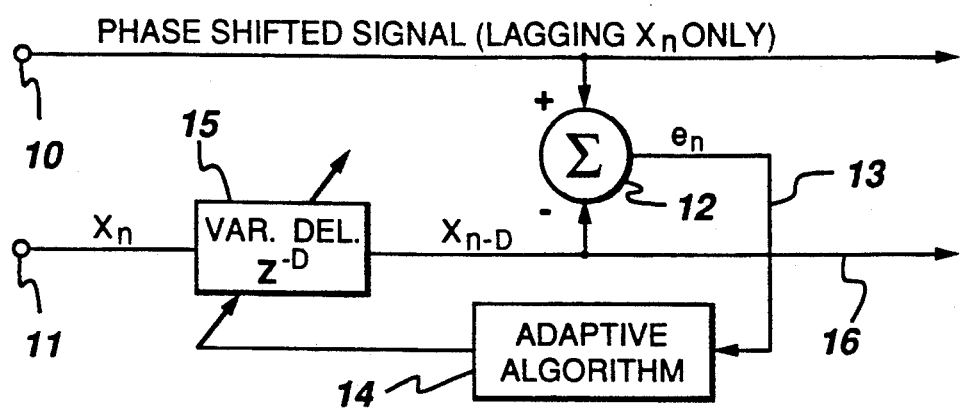
FIG. 1 is a schematic representation of an adaptive phase lag compensation circuit according to the prior art.

In the prior art arrangement for performing adaptive compensation of phase lag, shown in FIG. 1, a reference signal $X_n$ is applied to input terminal 10 and the desired signal is applied to input terminal 11. The reference signal is then subjected to an adjustable delay 15 of length D signal samples (represented as being in the Z domain because it is a mixture of time and frequency) to produce a delayed reference signal $X_{n-D}$ on conductor 16, which also serves as an output signal. Delayed signal $X_{n-D}$ is differentially summed with the desired signal at a summer 12 to develop an error signal en which is supplied on a conductor 13 to a means for performing an adaptive algorithm 14. The signal obtained from the adaptive algorithm is then used to adaptively adjust the delay applied to the reference signal $X_n$.

The updating equation for this arrangement is given by $$D_{n+1} = D_n + \mu^* e(n)^* [X(n-D-1) - X(n-D+1)]1 \quad 1$$

where
  D = the required delay,
  $\mu$ = a convergence factor,
  e = the error signal and
  X is the carrier signal.

In determining the required delay, the term $Z_1 = e^{-j\omega/f_1}$ and the term $Z_2 = e^{-j\omega/f_2}$, $\omega$ being the carrier frequency and f being a sampling rate. Only the integral portion of the delay is used in evaluating the two values of X, symmetrically disposed about time n−D.

This algorithm uses a symmetric difference to approximate the derivative of X with respect to delay D. However, as previously pointed out, it is limited to cases where the desired signal only lags the reference signal.

Figure 2A:
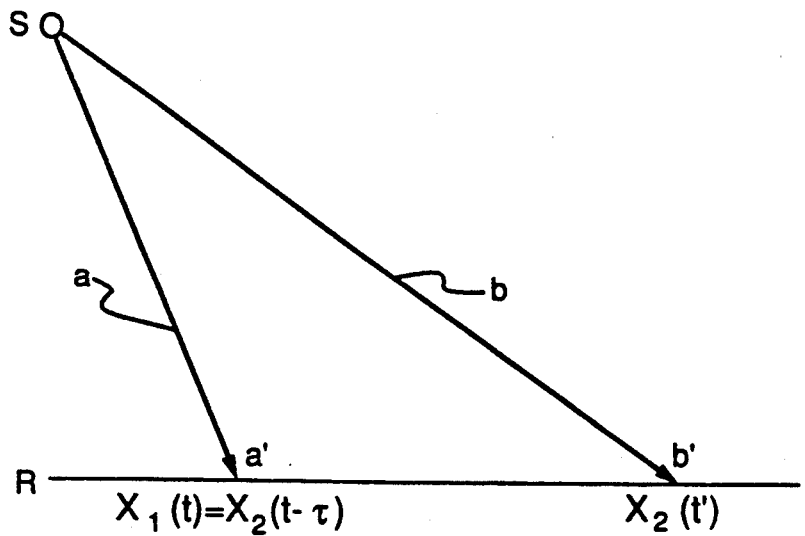
FIGS. 2A and 2B are diagrams illustrating the origin of both leading and lagging phase differences or time delays.
Figure 2B:
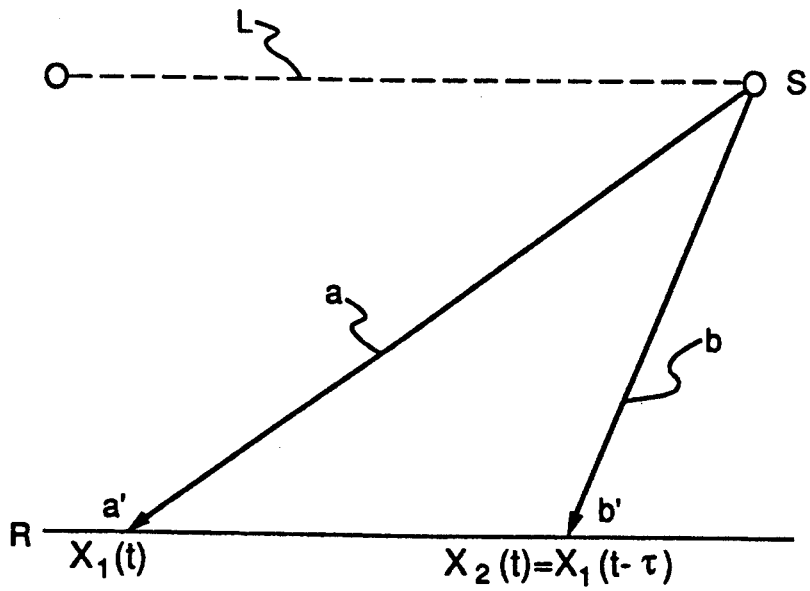

FIGS. 2A and 2B illustrate operation of a typical system which may engender the phase differences or time delays to which the present invention is directed. As an example, assume a signal source S is arranged to propagate a signal through a uniform, dissipative medium. Radar or Sonar would be typical of such arrangement. Also assume a receiver R is disposed in a linear array. Due to the difference between path lengths a, b between source S and points a', b' on receiver R, signals from source S will arrive at different times. As shown in FIG. 2A, the signal $X_2$ at point b' lags the signal at point a' and the signal at b' can be expressed in terms of the signal $X_1$ at a' by inclusion of the term $\tau$, indicating the phase difference or time differential between the signals. Similarly in FIG. 2B, the signal $X_1$ at a' can be expressed in terms of the signal $X_2$ at b'. In many instances, the same measurement or compensation arrangement could be used to measure phase difference by merely choosing the earlier of the two signals as a reference signal. In other cases, such as where source S may continuously traverse a locus L, as indicated in FIG. 2B, such a change of reference may be either impossible, or at least too cumbersome to utilize, where one of the signals is modulated in a complex manner. Such switching of the reference signal, if indeed possible, may require a complex arrangement necessitating additional calibration, or may lead to ambiguity in measurement as to which signal actually lags the other.

It is to be understood that the dissipative medium assumed in the illustration of FIGS. 2A and 2B is representative of variance from ideal performance of many physical systems. Such physical systems may also take the form of electrical or electronic components and circuits, such as the transformers, detectors and modulators described above.

Figure 3:
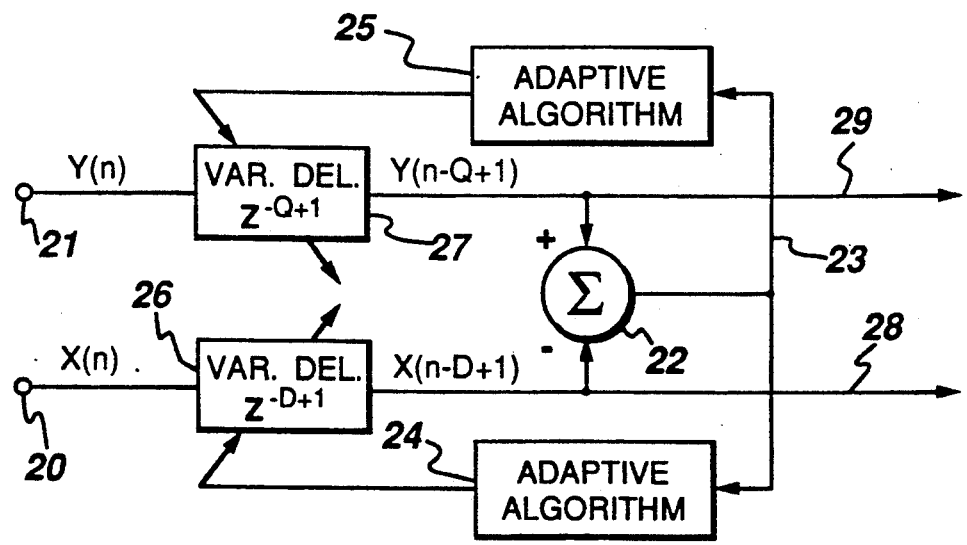
FIG. 3 is a schematic representation of the adaptive phase compensation circuit according to the present invention.

The invention, as illustrated schematically in FIG. 3, overcomes the difficulty of accommodating both leading and lagging phase differences while enabling adaptive phase compensation, by providing adjustable delays in both the reference and desired signal paths. The delay can be adjusted in an adaptive manner by using a gradient-based update algorithm for each adjustable delay.

A gradient-based algorithm suitable for use with the invention, where B is the parameter to be estimated, can be expressed by the equation $$B_{n+1} = B_n - \mu^* \nabla \epsilon^2 \quad 2$$

where minimization of the mean squared error $\epsilon^2$, is sought. The term $\nabla \epsilon^2$ is the gradient of the scalar function $\epsilon^2$, where $\nabla$ represents the gradient operator. The algorithm of equation (2) operates to minimize the mean squared error (MSE) signal by approximating it with the instantaneous value of the error, given by $$\begin{aligned}\epsilon^2 &= E[e^2] \\ &= e^2\end{aligned} \quad (3)$$

where the error signal, e, in terms of FIGS. 2A and given by $$e = (X_1 - X_2).$$

By separately applying this algorithm to each of the two adjustable delays, approximating $\epsilon^2$ by $e^2$, and taking the delays D and Q in each respective signal path as the parameters for which optimization is sought, an approximation of the derivative of the delays D and Q by symmetric differences for the gradients of those delays yields the following update equations for the respective delays:

$$D_n + \mu_D{}^*e(n)^*[X_2(n-D-1) - X_2(n-D+1)] \qquad 4$$

$$Q_{n+1} = Q_n - \mu_Q{}^*[X_1(n-Q-1) - X_1(n-Q+1)] \qquad 5$$

Figure 6:
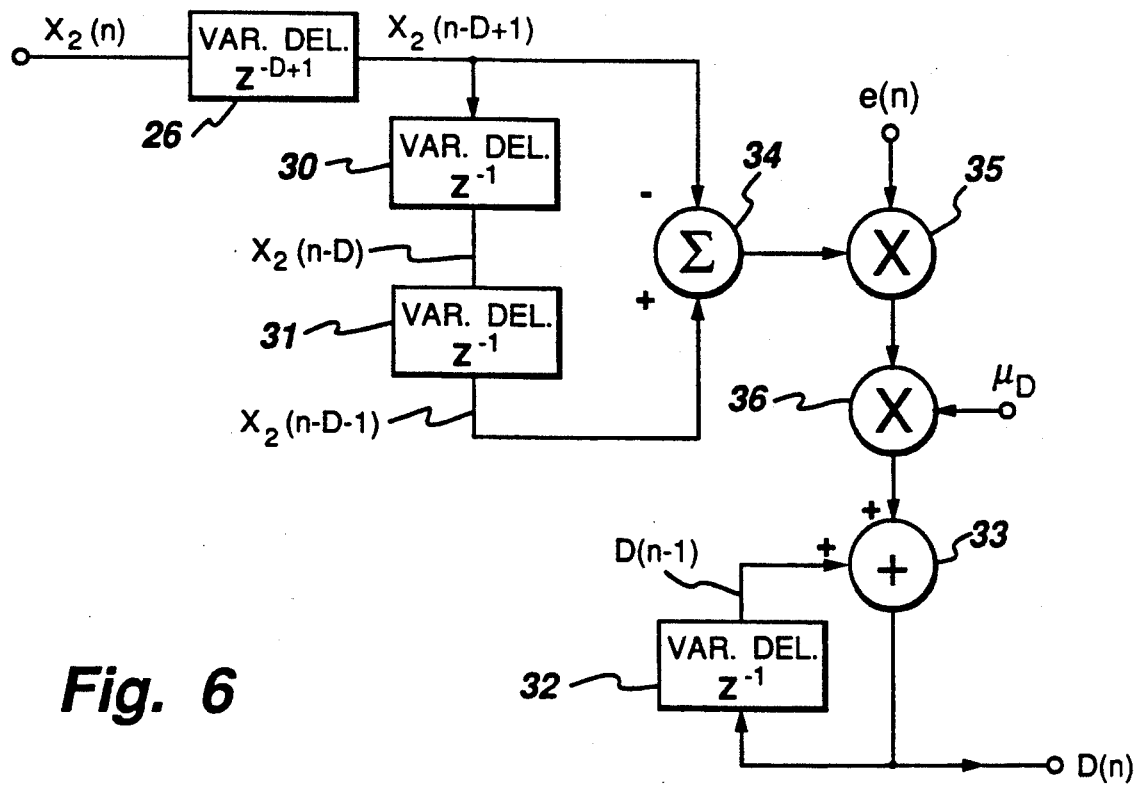
FIG. 6 is a schematic representation of the adaptive algorithm used in a preferred embodiment of the invention.

Adaptive algorithms 4 and 5 are performed at blocks 24 and 25, respectively, in FIG. 3. Equation 4 is schematically illustrated in both FIGS. 6 and 7 in which serial delays 30 and 31 develop signals $X_2(n-D-1)$ and delay 26 develops signals $X_2(n-D+1)$ which are then differentially summed at a differential summer 34 and multiplied, in turn, by signal e(n) at a multiplier 35 and by signal $\mu_D$ at a multiplier 36. It should be noted that delays 26 and 27 of FIG. 3 may be performed at block 26 of FIGS. 6 and 7 for clarity although only the update equation (4) is illustrated for simplicity. Output signal $D_n$ is fed through a feedback delay 32 to a final adder 33 that produces the update signal D(n+1). By providing a corresponding arrangement for the adaptive algorithm of block 25 of FIG. 3 to develop a corresponding value for $X_1$, both phase lead and phase lag can be estimated and compensated. The resulting delay evaluation potentially represents both the coarse (full sample delays) and fine (fractional sample delays) tuning for phase compensation. In practice, it is often desirable, for purposes of circuit simplicity, to provide only a single sampling rate. Under such circumstances, only the integral portions of the sample delay would be used and only phase differences representing full sample delays would be compensated.

Figure 4:
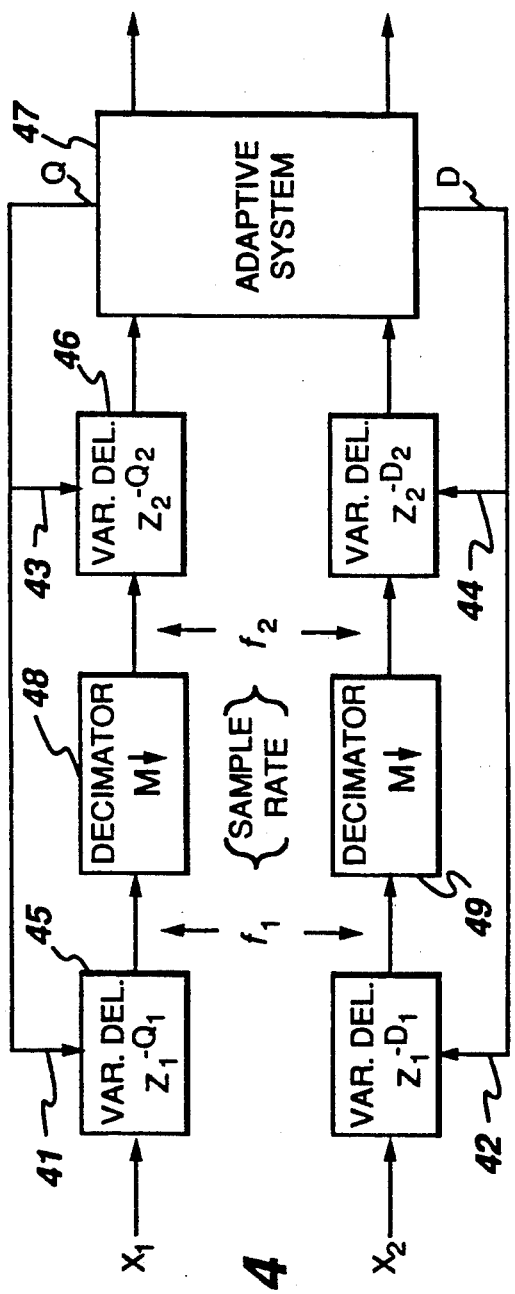
FIG. 4 is a schematic representation of oversampling-/decimation processing as preferably implemented in accordance with the invention.

If a more accurate compensation is required for phase shift, as in some sensor interface applications, the signals can be decimated to lower sampling frequencies and the adaptive phase estimation performed at the lower rate, as schematically illustrated in FIG. 4. The integer part of the phase estimation signal 43, 44 would then be used to compensate for full sample delays at the lower rate while the fractional part of the delay estimation signal 41, 42 would be used for compensation of the signals at the higher sampling rate.

Conversely, the above procedure can be reversed by oversampling the incoming signals at a much higher sampling rate, $f_1$ than required for the desired resolution of the error signal, decimating by a factor M to the required sampling rate (e.g. the Nyquist rate) $f_2$ by decimators 48, 49 (indicated by the downward-pointing arrow) so that $f_2 = f_1/M$, performing delay estimation at the lower rate, and carrying out the compensation at both the lower and higher rates. By this procedure, integral portions of the delay compensate the lower rate samples and the fractional portions of the delay compensate the higher rate samples.

Figure 5:
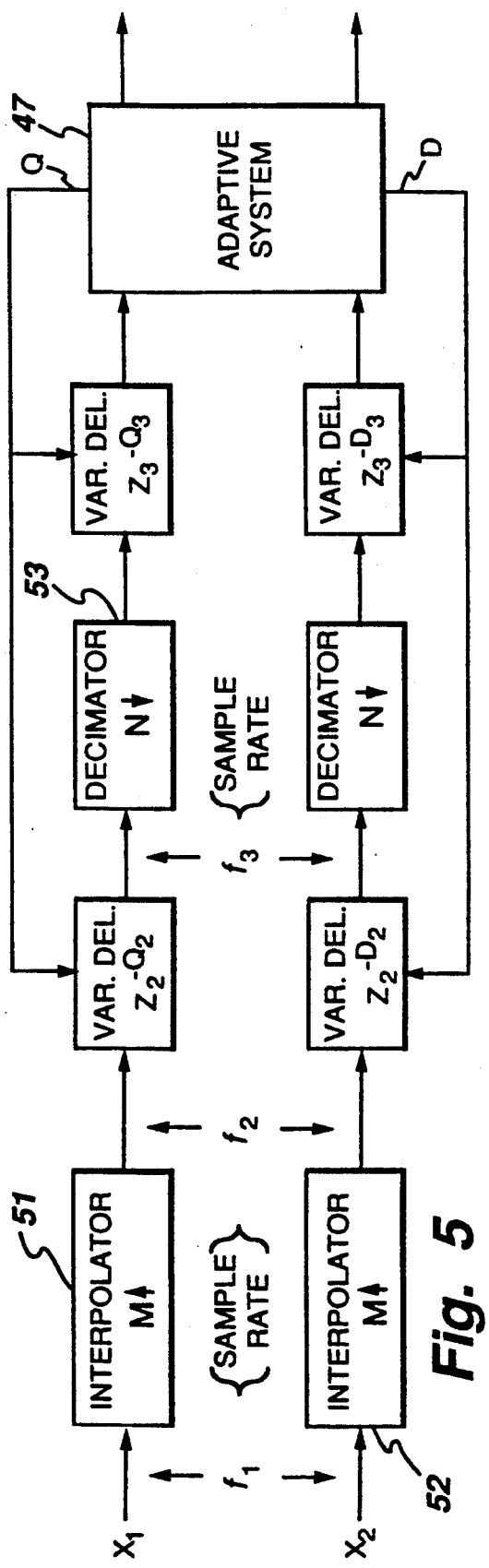
FIG. 5 is a schematic representation of interpolation/decimation processing as preferably implemented in accordance with the invention.

Another alternative for developing compensation for higher accuracy phase shift, illustrated in FIG. 5, is to synthesize a higher sampling rate through the use of interpolative filters 51, 52, (indicated by the upward-pointing arrow) so that $f_2 = Mf_1$, rather than actually sampling at the higher rate, since the phase angle represented by the sampling rate (and which determines the resolution of the system) varies inversely with the effective sampling frequency. The remainder of the circuitry is identical to that of FIG. 4. Sample delays at high frequencies therefore represent smaller angles than those at lower frequencies.

In the circuit of FIG. 5, sampling rate $f_2 = Mf_1$, sampling rate $f_3 = f_2/N$, and $N, M \geq 1$. Thus sample rate $f_1$ is increased to $f_2$ by interpolative filter 51 and decreased to $f_3$ by a decimator 53 (the upward pointing arrow being indicative of interpolation and the downward pointing arrow being indicative of decimation).

The above techniques for increasing compensation accuracy by oversampling and interpolation merely require separating the variable delay, shown at 26, 27 of FIG. 3, into two portions such as 45 and 46 of FIG. 4, corresponding to the different frequencies of, and responsive to corresponding portions of the output signal of, the adaptive algorithm circuit. The operation of the arrangement of FIG. 3 remains otherwise unaltered when employed with the arrangement of FIG. 4 and these techniques can be applied to achieve any desired degree of accuracy of compensation as a matter of design in view of the present disclosure. Therefore, the remainder of the adaptive arrangement is illustrated merely as comprising an "adaptive system" 47, as shown in FIGS. 4 and 5. Also, since operation of the circuit of FIG. 3 is unaltered by the adoption of these techniques, they can also be employed with the alternative embodiment shown in FIG. 8 and described in greater detail below.

To consider an alternative method of minimizing the mean squared error in the algorithm of Equation (2), reference is again made to FIGS. 2A and 2B for expressions of the delay. Equation (3) can then be expressed as $$\begin{aligned}\epsilon^2 &= E[e^2] \\ &= E[(X_1 - X_2)^2] \\ &= E[(X_1(n - \overline{Q}) - X_2(n - \overline{D}))^2]\end{aligned} \qquad (6)$$

where, in terms of FIG. 3, $$\begin{aligned}\tau &= (n - \overline{Q}) - (n - \overline{D}), \\ &= \overline{D} - \overline{Q}\end{aligned}$$

from which it follows that $$\begin{aligned}\epsilon^2 &= \sigma_1^2 + \sigma_2^2 - 2\phi_{12}(\overline{D} - \overline{Q}) \\ &= 2\sigma_1^2 - 2\phi_{12}(D - Q)\end{aligned} \qquad (7)$$

where $\sigma_1^2$ and $\sigma_2^2$ are the average power in $X_1$ and $X_2$, respectively, $\overline{D}$ and $\overline{Q}$ represent the integer parts of D and Q, respectively, and $\phi_{12}$ is the cross-correlation between $X_1$ and $X_2$. In this case, the mean squared error can be minimized by maximization of the cross-correlation function $$\phi_{12}(\tau) = E[X_1(t)X_2(t-\tau)]. \qquad 8$$

Since $X_1$ and $X_2$ are derived from the same signal source, the cross-correlation defined by equation (8) is the autocorrelation function for both signals. The maximum of this autocorrelation is achieved when $\tau = 0$.

Therefore the delay can be estimated by maximizing equation (8) (i.e. minimizing $-\phi_{12}$) by the same technique of using symmetric differences as above, resulting in the following update equations for D and Q:

$$D_{n+1} = D_n + \mu_D X_1(n-Q)[X_2(n-D-1) - X_2(n-D+1)] \quad (9)$$

$$Q_{n+1} = Q_n + \mu_Q X_2(n-D)[X_1(n-Q-1) - X_1(n-Q+1)] \quad (10)$$

Figure 7:
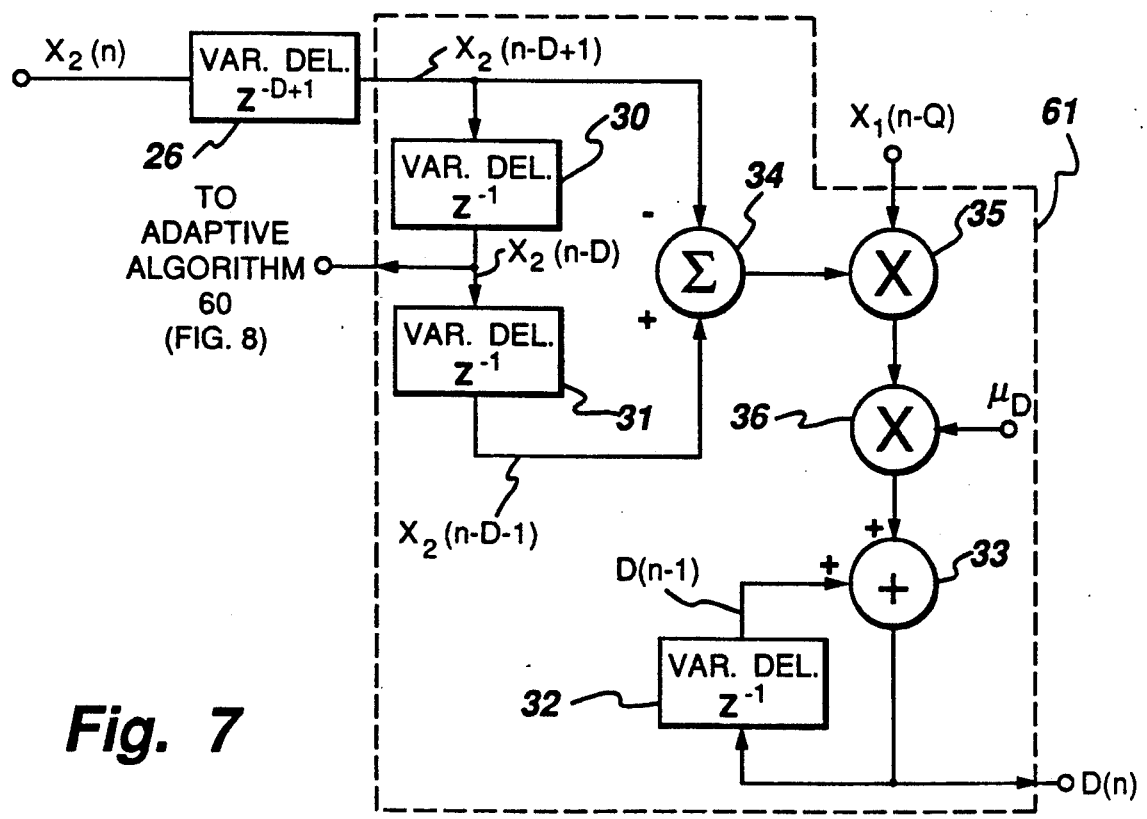
FIG. 7 is a schematic representation of the adaptive algorithm used in a variant of the invention.
Figure 8:
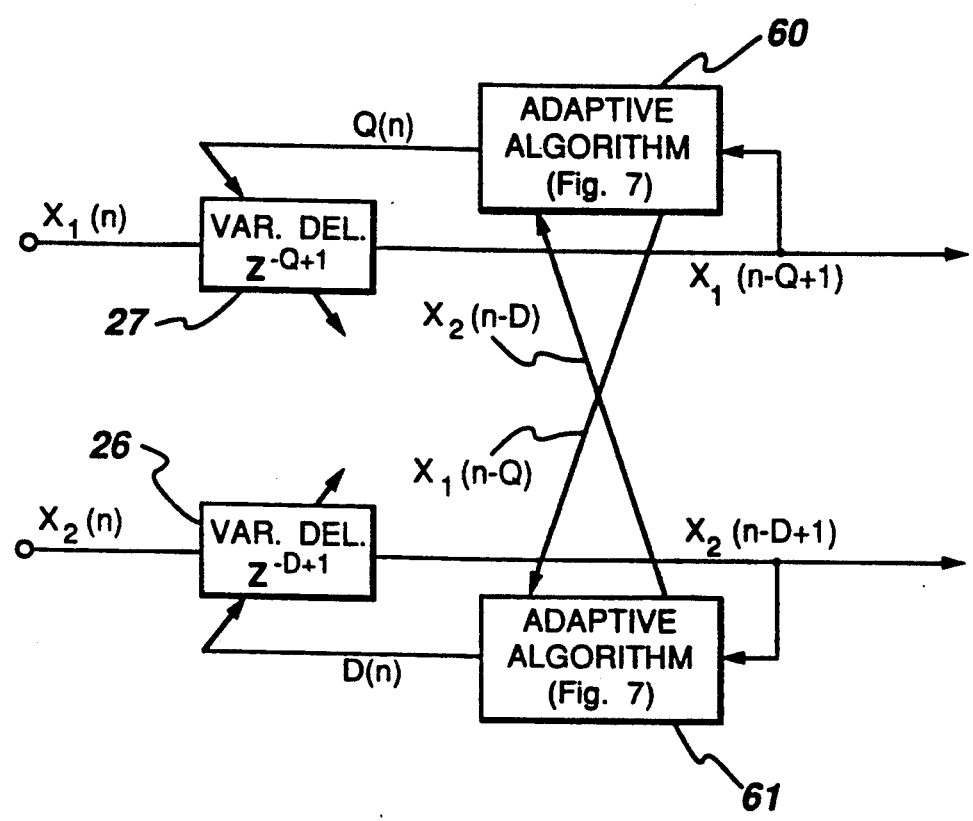
FIG. 8 is a modification of the embodiment illustrated in FIG. 3, utilizing the adaptive circuit of FIG. 7.

This adaptive algorithm, corresponding to either one of blocks 60 and 61 of FIG. 8, is performed by the circuitry illustrated schematically in FIG. 7 and is equivalent to that given by equations (4) and (5), but with the very important distinction that no error signal is evaluated. Specifically, if the adaptive algorithm performed by the circuitry illustrated in FIG. 7 is represented by the circuitry of block 61 in FIG. 8, block 60 would be identical but with signal $X_1$ substituted for signal $X_2$ and delay Q substituted for delay D, and vice-versa, the cross-correlation being provided by the crossed signals $X_1$ and $X_2$ between the two identical circuits 60 and 61. The adaptive algorithm in this case uses signals $X_1$ and $X_2$ for feedback instead of the error term used in equations (4) and (5). Therefore, the differential summer 22 of FIG. 3 can be omitted, the function of developing an error signal being thus obviated by the cross-connection of the adaptive circuits. In this case, the overall organization of the invention illustrated in FIG. 3 would be modified to that illustrated in FIG. 8. One particularly important advantage of this alternative technique over that represented by equations (4) and (5) is that a mismatch of amplitudes phase delay estimate.

In summary, an arrangement and method has been provided which enables accommodation of both leading and lagging phase differences between signals while also providing adaptive compensation for both leading and lagging phase differences.

While the invention has been described in terms of a single preferred embodiment, those skilled in the art will recognize that the invention can be practiced with modification within the spirit and scope of the appended claims.

What is claimed is:

1. A circuit for adaptively compensating for an arbitrary phase difference between two time-varying signals, one of said signals being a reference signal and the other of said signals being a desired signal, said circuit comprising:

first controllable delay means for delaying said time-varying reference signal in response to an error signal;

second controllable delay means for delaying said time-varying desired signal in response to said error signal; and differential summing means coupled to said first and second controllable delay means for generating said error signal in response to respective output signals of said first and second controllable delay means.

2. A circuit as recited in claim 1 including first adaptive circuit means coupled between said differential summing means and said first controllable delay means, and second adaptive circuit means coupled between said differential summing means and said second controllable delay means, said first and second adaptive circuit means, respectively, producing a control signal, respectively, in response to said error signal, for adjusting the delay introduced by each of said first and second controllable delay means, respectively.

3. A circuit as recited in claim 1 wherein said first controllable delay means comprises first and second delays and first decimator means coupling the output of said first delay to the input of said second delay, and wherein said second controllable delay means comprises third and fourth delays and second decimator means coupling the output of said third delay to the input of said fourth delay.

4. A circuit as recited in claim 3 wherein said first controllable delay means further comprises first interpolator means coupled to the input of said first delay and responsive to said time-varying reference signal, and wherein said third controllable delay means comprises second interpolator means coupled to the input of said third delay.

5. A method for adaptively compensating for an arbitrary phase difference between two time-varying signals, comprising the steps of:

differentially summing said two signals to derive a phase error signal; and selectively delaying each of said two signals in response to said phase error signal.

6. A method as recited in claim 5, wherein:

said two time-varying signals comprise signal samples taken at a first sampling rate; and the selectively delaying step comprises adjusting the delay of the selectively delaying step at a second sampling rate.

7. A method as recited in claim 6, wherein said second sampling rate is identical to said first sampling rate.

8. A method as recited in claim 6, wherein said second sampling rate is lower than said first sampling rate.

9. A method as recited in claim 6, including the further step of:

interpolating additional signal samples between said signal samples taken at said first sampling rate to provide additional samples of said two signals at a third sampling rate which is higher than either of said first and second sampling rates.

10. A circuit for adaptively compensating for an arbitrary phase difference between two time-varying signals, one of said signals being a reference signal and the other of said signals being a desired signal, said circuit comprising:

first controllable delay means for delaying a time varying reference signal to produce a first delayed signal;

second controllable delay means for delaying a time-varying desired signal to produce a second delayed signal;

first adaptive circuit means coupled to said first controllable delay means for controlling said first controllable delay means to delay said time-varying reference signal in response to said second delayed signal; and second adaptive circuit means coupled to said second controllable delay means for controlling said second controllable delay means to delay said time-varying desired signal in response to said first delayed signal.

11. A circuit as recited in claim 10 wherein each respective one of said first and second adaptive circuit means comprises:

third controllable delay means coupled to the output of a respective one of said first and second controllable delay means;

differential adder means coupled to the output of said third controllable delay means and to the output of said respective one of said first and second controllable delay means;

first multiplier means coupled to the output of said differential adder means and being responsive to a phase error input signal; and an update adder means coupled to the output of said multiplier means, said update adder means having feedback delay means coupled thereto.

12. A circuit as recited in claim 11, wherein said adaptive circuit means further includes a second multiplier means coupled to the output of said first multiplier means for multiplying the output signal of said first multiplier means by a convergence factor signal.

13. A circuit as recited in claim 10, wherein each respective one of said first and second adaptive circuit means comprises:

third delay means coupled to the output of a respective one of said first and second controllable delay means;

differential adder means coupled to the output of said respective one of said first and second controllable delay means and said third delay means;

first multiplier means coupled to the output of said differential adder means and responsive to an input signal from the other one of said first and second adaptive circuit means; and an update adder means coupled to the output of said multiplier means, said update adder means having feedback delay means coupled thereto.

14. A circuit as recited in claim 13, wherein said adaptive circuit means further includes a second multiplier means coupled to the output of said first multiplier means for multiplying the output signal of said first multiplier means by a convergence factor signal.

15. A circuit as recited in claim 10 wherein said first controllable delay means comprises first and second delays and first decimator means coupling the output of said first delay to the input of said second delay, and wherein said second controllable delay means comprises third and fourth delays and second decimator means coupling the output of said third delay to the input of said fourth delay.

16. A circuit as recited in claim 15 wherein said first controllable delay means further comprises first interpolator means coupled to the input of said first delay and responsive to said time-varying reference signal, and wherein said third controllable delay means comprises second interpolator means coupled to the input of said third delay.

17. A method for adaptively compensating for an arbitrary phase difference between a first time-varying signal and a second time-varying signal, comprising the steps of:

delaying each of said first and second time-varying signals to derive a first delayed signal and a second delayed signal respectively;

adjusting the delay of said first delayed signal in response to said second delayed signal; and adjusting the delay of said second delayed signal in response to said first delayed signal.

18. A method as recited in claim 17, wherein:

said first and second time-varying signals comprise signal samples taken at a first sampling rate; and the delays introduced in the delay adjusting steps are selectively updated at a second sampling rate.

19. A method as recited in claim 18, wherein said second sampling rate is identical to said first sampling rate.

20. A method as recited in claim 18, wherein said second sampling rate is lower than said first sampling rate.

21. A method as recited in claim 18, including the further step of:

interpolating additional signal samples between said signal samples taken at said first sampling rate to provide additional samples of said first and second time-varying signals at a third sampling rate which is higher than either of said first and second sampling rates.

22. An adaptive circuit comprising:

circuit means for receiving a first input signal;

controllable delay means coupled to said circuit means;

differential adder means coupled to the output of said circuit means and said first controllable delay means;

first multiplier means coupled to the output of said differential adder means and including means for receiving a second input signal; and update adder means coupled to the output of said multiplier means, said update adder means having feedback delay means coupled thereto.

23. An adaptive circuit as recited in claim 22, including second multiplier means coupled to the output of said first multiplier means for multiplying the output signal of said first multiplier means by a third input signal.

* * * * *